(12) United States Patent
Hirakawa

(10) Patent No.: US 7,394,026 B2
(45) Date of Patent: Jul. 1, 2008

(54) MULTILAYER WIRING BOARD

(75) Inventor: Eiichi Hirakawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 299 days.

(21) Appl. No.: 11/057,212

(22) Filed: Feb. 15, 2005

(65) Prior Publication Data
US 2005/0184393 A1  Aug. 25, 2005

(30) Foreign Application Priority Data
Feb. 20, 2004  (JP) .............................. 2004-044306

(51) Int. Cl.
*H01R 12/04* (2006.01)
*H05K 1/11* (2006.01)

(52) U.S. Cl. ........................ 174/261; 257/737

(58) Field of Classification Search ......... 257/737–738; 174/261
See application file for complete search history.

(56) References Cited

U.S. PATENT DOCUMENTS 6,452,115 B2 * 9/2002 Horiuchi et al. ............ 174/261

2005/0077081 A1 * 4/2005 Govind et al. ............... 174/260

FOREIGN PATENT DOCUMENTS

JP  11-297885  10/1999

* cited by examiner

*Primary Examiner*—Jeremy C Norris
(74) *Attorney, Agent, or Firm*—Kratz, Quintos & Hanson, LLP

(57) ABSTRACT

In a wiring layer of a first layer of a multilayer wiring board, respective wiring patterns are drawn out from pads in an outermost portion of a pad placement region, from pads located on diagonal lines in the vicinities of the corners of the relevant region, and from pads located in diagonal directions between adjacent rows in an internal portion of the relevant region. Further, in each of wiring layers of second and subsequent layers, among pads electrically connected through via holes to the pads from which wiring patterns are not drawn out in a wiring layer of an upper layer, respective wiring patterns are drawn out from pads in an outermost portion of a pad placement region; and from pads located in diagonal directions between adjacent rows in an internal portion of the relevant region.

4 Claims, 7 Drawing Sheets

THIRD LAYER

WIRING IN THIRD LAYER

MULTILAYER WIRING BOARD

CROSS-REFERENCE TO RELATED APPLICATIONS

This application is based on and claims priority of Japanese Patent Application No. 2004-44306 filed on Feb. 20, 2004, the entire contents of which are incorporated herein by reference.

BACKGROUND OF THE INVENTION (a) Field of the Invention

The present invention relates to a multilayer wiring board, more specifically, to a multilayer wiring board adapted for an effective drawing out (fan out) of wiring patterns for each wiring layer.

(b) Description of the Related Art

In recent semiconductor devices, the functionality and density of logic devices have been enhanced, and the number of input-outputs has increased. Accordingly, products have been provided in which a shortage of an electrode formation space due to an increase in the number of the input-outputs is compensated by placing a large number of electrodes on an electrode formation surface of a semiconductor element (chip). For example, in a type of products in which a semiconductor chip is mounted on a wiring board by flip-chip bonding, where electrodes are arranged only in a peripheral portion of an electrode formation surface of the semiconductor chip, just the provision of one layer of wiring patterns in the wiring board makes it possible to connect all the electrodes to the wiring patterns. Namely, a wiring pattern can be drawn out from a pad formed at a position on the wiring board which corresponds to each electrode of the chip. However, where a large number of electrodes are arranged in a grid or an area array pattern on the electrode formation surface of the semiconductor chip, there may occur a disadvantage in that wiring patterns cannot be drawn out from all of pads in one wiring layer, although occurrence of the disadvantage depends on the number of pads and the arrangement pitch of pads formed on the wiring board.

As a method of eliminating such a disadvantage, there is the following method: a wiring board on which a semiconductor chip is to be mounted is formed to be multilayered, and all of electrodes of the semiconductor chip are respectively connected to wiring patterns by appropriately placing the wiring patterns in wiring layers stacked. One example thereof is shown in FIG. 4. In the constitution shown in FIG. 4, a semiconductor chip 5 in which a large number of electrodes 6 are arranged in a grid pattern on a mount surface is mounted on a multilayer wiring board 1 in which wiring layers are stacked in four layers. Using this multilayer wiring board 1, all of the electrodes 6 of the semiconductor chip 5 can be electrically connected to wiring patterns 2, and to wiring patterns 2a in internal layers through via holes 3, and further to external connection terminals 4 through via holes 3.

When the semiconductor chip is mounted on the wiring board as described above, in case of the number of electrodes being not large, a multilayer wiring board having four layers such as shown in FIG. 4 is enough. However, for example, where a semiconductor chip with 30×30 pins, 40×40 pins, or the like, in which an extremely large number of electrodes are arranged, is mounted, the number of wiring layers needs to be further increased because the number of rows for which a fan out (drawing out of wiring patterns) can be performed from each wiring layer is limited. In this case, in order to constitute a multilayer wiring board by stacking wiring layers each of which has wiring patterns formed at high density, a high-density wiring method such as a build-up method is employed.

FIG. 5 schematically shows the constitution of a multilayer wiring board according to one example of the prior art, which is constituted using a build-up method, and shows a partial cross-sectional structure thereof. In the illustrated multilayer wiring board (build-up printed circuit board) 20, four wiring layers 22 are stacked on each of the top and bottom of a core substrate 21 with interlayer insulating layers 23 interposed therebetween. For convenience, each of the wiring layers 22 is referred to as a wiring layer of a "first layer," that of a "second layer,"..., and that of an "eighth layer," respectively, from the top. Each wiring layer 22 includes a plurality of pads P placed in a predetermined arrangement, and a plurality of wiring patterns WP each of which is formed in such a manner that one end thereof is connected to any one of the plurality of pads P and that the other end thereof is drawn outward (left side in the illustrated example). It is noted that, among the pads P included in the wiring layers 22, there are also pads P to which wiring patterns WP are not connected. Further, vertically adjacent wiring layers 22 (pads P) are electrically connected to each other through via holes VH (conductors filled therein) formed in the interlayer insulating layer 23. Incidentally, a semiconductor chip is mounted by flip-chip bonding on the pads P provided in the wiring layer 22 of the first layer, as indicated by dashed lines in the drawing.

FIGS. 6A and 6B schematically show the arrangement of pads and the drawing-out of wiring patterns in (portion of) the wiring layers of the first and second layers partially constituting the above-described multilayer wiring board 20. The arrangement of the pads P1 and P2 provided in the wiring layer 22 of the first layer coincides with the arrangement of electrodes arranged in a grid pattern on a mount surface of a semiconductor chip to be mounted on the multilayer wiring board 20. Further, for the pads P1 and P2 from which wiring patterns WP have been drawn out in the wiring layer of the first layer (FIG. 6A), there is no need to place corresponding pads in the wiring layer of the second layer (FIG. 6B). Accordingly, pads to be provided in the second layer correspond to the pads from which wiring patterns WP are not drawn out in the first layer, and both of these pads are electrically connected to each other through the via holes VH (FIG. 5).

As shown in FIGS. 6A and 6B, in a known method of drawing out wiring patterns WP, the wiring patterns WP are drawn out in groups of two rows each in order from outer portions of rectangular regions PR1 and PR2 (hereinafter also referred to as "pad placement regions") in which the pads are placed. In this case, for the pads P2 located in internal portions (second row from the outside) of the pad placement regions PR1 and PR2, wiring patterns WP are passed through the spaces between adjacent pads P1 in the outermost portion to be linearly drawn out to the respective outsides of the pad placement regions PR1 and PR2 as shown in the drawing. Thus, in each of the arrangements of the wiring patterns WP on the outsides of the pad placement regions PR1 and PR2, the wiring patterns WP drawn out from the pads P1 placed in the outermost portion of the relevant pad placement region and the wiring patterns WP drawn out from the pads P2 in an internal portion of the relevant pad placement region are alternately placed.

Technologies relating to the above-described prior art include, for example, as described in Japanese unexamined Patent Publication (JPP) 11-297885, a multilayer circuit board in which circuit boards are stacked. In this multilayer circuit board, for the circuit board of a first layer on which an electronic component is to be mounted, circuit patterns are drawn out from all of lands placed in the outermost portion of a region in which lands are arranged, from lands placed on a diagonal line of the region, and from lands placed in a vicinity of the diagonal line; and, for each of the circuit boards of the second and subsequent layers, circuit patterns are drawn out from all of lands placed in an outermost portion of a region in which lands are arranged, and lands placed in a peripheral portion of a vacant space which is formed in the direction of the diagonal line by drawing out the circuit patterns in the upper layers.

As described above, in the prior art, where a semiconductor chip with 30×30 pins, 40×40 pins, or the like, in which an extremely large number of electrodes are arranged, is mounted on a wiring board, the number of wiring layers tends to increase because the number of rows for which a fan out (drawing out of wiring patterns) can be performed from each wiring layer is limited.

However, the increase in the number of wiring layers has serious problems of product yield, reliability, and cost. Namely, where a wiring board is formed to be multilayered, wiring patterns are formed in each layer, and the wiring patterns are electrically connected to each other between layers through via holes, thus sequentially stacking the layers. Accordingly, extremely high precision is required for a manufacturing process thereof, and the product reliability is not necessarily, high even at present. Further, the case of multilayer stacking involves technical difficulty because the non-existence of defects in all layers is required. Accordingly, a reduction in the number of wiring layers is effective for manufacturing a multilayer wiring board with high yield.

Moreover, when a drawing out (fan out) of wiring patterns is performed for each wiring layer, there may occur a disadvantage in that lower wiring layers cannot be reached where wiring patterns are drawn out in order from the upper wiring layer (i.e., wiring patterns must be drawn out in an intermediate wiring layer, and connections to the underlying wiring layer cannot be established by means of via holes or through holes).

For example, in the case of a multilayer wiring board by a build-up method such as shown in FIGS. 5, 6A, and 6B, wiring patterns are drawn out in groups of two rows each in order from an outer portion of the pad placement region PR1 or PR2 in each of the first and second layers. Accordingly, when this drawing-out method is applied to the third layer, a disadvantage occurs as shown in FIGS. 7A and 7B. Namely, the pads P1 provided in the third layer correspond to the five pads from which wiring patterns WP are not drawn out in the second layer (FIG. 6B), and the third and second layers can be electrically connected to each other through the via holes VH (FIG. 5) formed on the five pads P1. However, the third layer and the underlying layers (in the example shown in FIG. 5, the fourth and fifth layers on the core substrate 21) cannot be connected to each other, because the regions of through holes TH (FIG. 7A) to be formed in the core substrate 21 overlap each other and the through holes cannot be arranged in terms of space. Accordingly, wiring patterns WP must be fanned out in the third layer as shown in FIG. 7B. As a result, there has been a disadvantage in that the wiring layers 22 of the fourth and subsequent layers of the build-up printed circuit board 20 (FIG. 5) are not effectively used.

In order to cope with such a disadvantage, it is conceived that the diameter of the through holes TH to be formed in the core substrate 21 is reduced. However, since such through holes are often formed by drilling, the diameter of the through holes is apt to increase under present circumference (approximately 250 to 300 μm in the state if the art). Accordingly, this is not an effective method because of technical limitations in reducing the diameter of the through holes. Further, as the causes of the above-described disadvantage, factors such as the line width of wiring patterns passed through the spaces between adjacent pads are recurred in addition to the size of the through holes. However, there are similarly technical limitations in reducing the line width of the wiring patterns.

SUMMARY OF THE INVENTION

An object of the present invention is to provide a multilayer wiring board which mounts an electronic component such as a semiconductor element or a semiconductor device having electrodes arranged in a grid pattern on a mount surface thereof, and which is capable of effectively reducing the number of stacked layers, and of contributing to an improvement in yield on a product basis and a reduction in cost.

To attain the above object, according to the present invention, there is provided a multilayer wiring board including a plurality of wiring layers stacked, each wiring layer having a plurality of pads and a plurality of wiring patterns, the plurality of pads being arranged in a grid pattern to correspond to an arrangement of electrodes of an electronic component to be mounted thereon, each wiring pattern being formed so that one end thereof is connected to any one of the plurality of pads and that another end thereof is drawn out to an outside from an inside of a region in which the pads are placed, wherein in the wiring layer of a first layer on which the electronic component is to be mounted, respective wiring patterns are drawn out from all of pads placed in an outermost portion of the region in which the pads are placed, from pads placed on a diagonal line in a vicinity of a corner of the relevant region, and from each pad located in a diagonal direction between adjacent rows among pads placed in rows in an internal portion of the relevant region, and wherein in each of the wiring layers of second and subsequent layers, respective wiring patterns are drawn out from all of pads placed in an outermost portion of a region in which the relevant pads are placed, among the pads electrically connected through via holes to the pads from which wiring patterns are not drawn out in the wiring layer of an upper layer, and from each pad located in a diagonal direction between adjacent rows or located apart from each other by a predetermined distance in a lateral direction among pads placed in rows in an internal portion of the relevant region.

DESCRIPTION OF THE PREFERRED EMBODIMENT

Hereinafter, an embodiment of a multilayer wiring board according to the present invention will be described with reference to FIGS. 1 to 3B.

Figure 1:
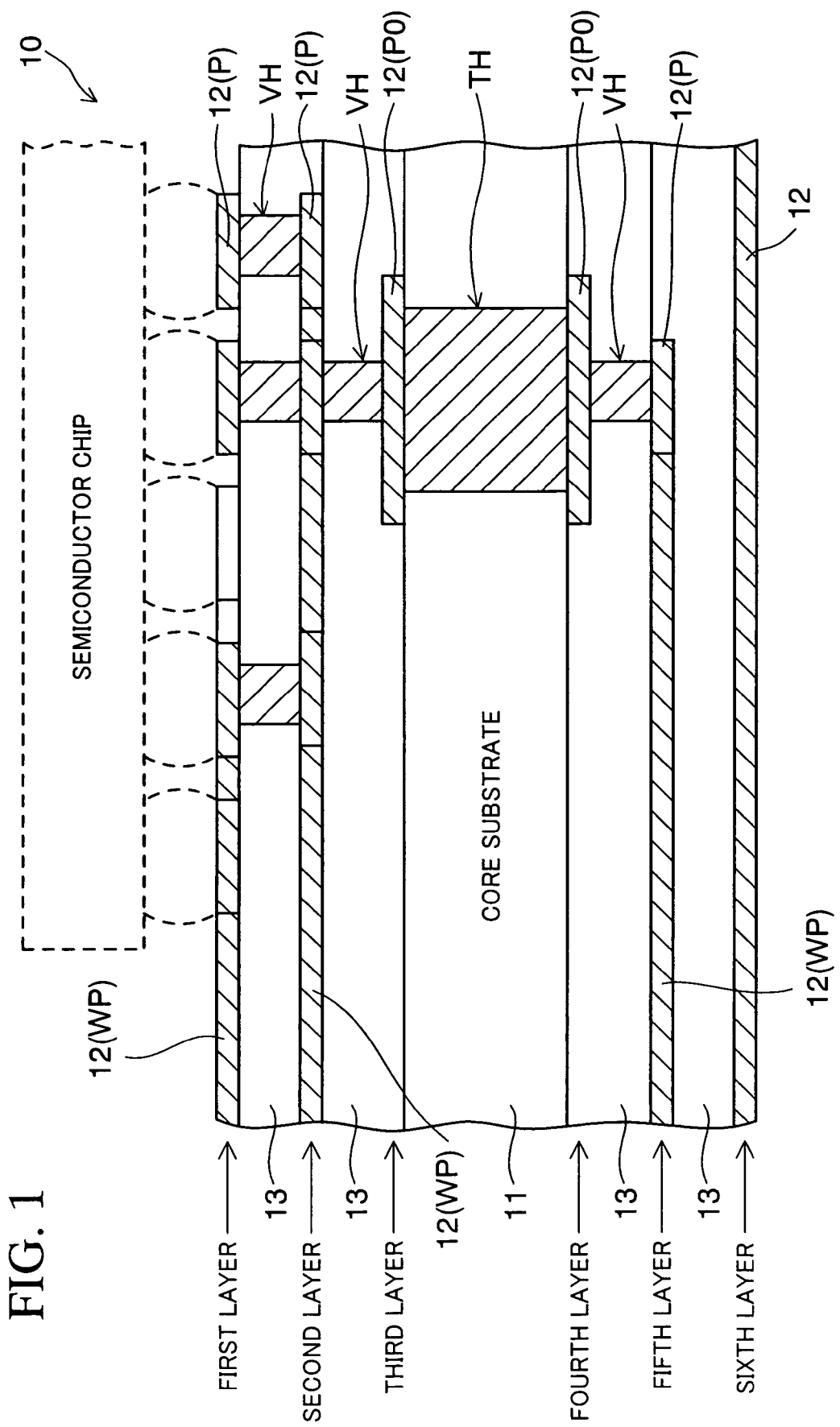
FIG. 1 is a cross-sectional view schematically showing (portion of) the constitution of a multilayer wiring board according to an embodiment of the present invention.
Figure 5:
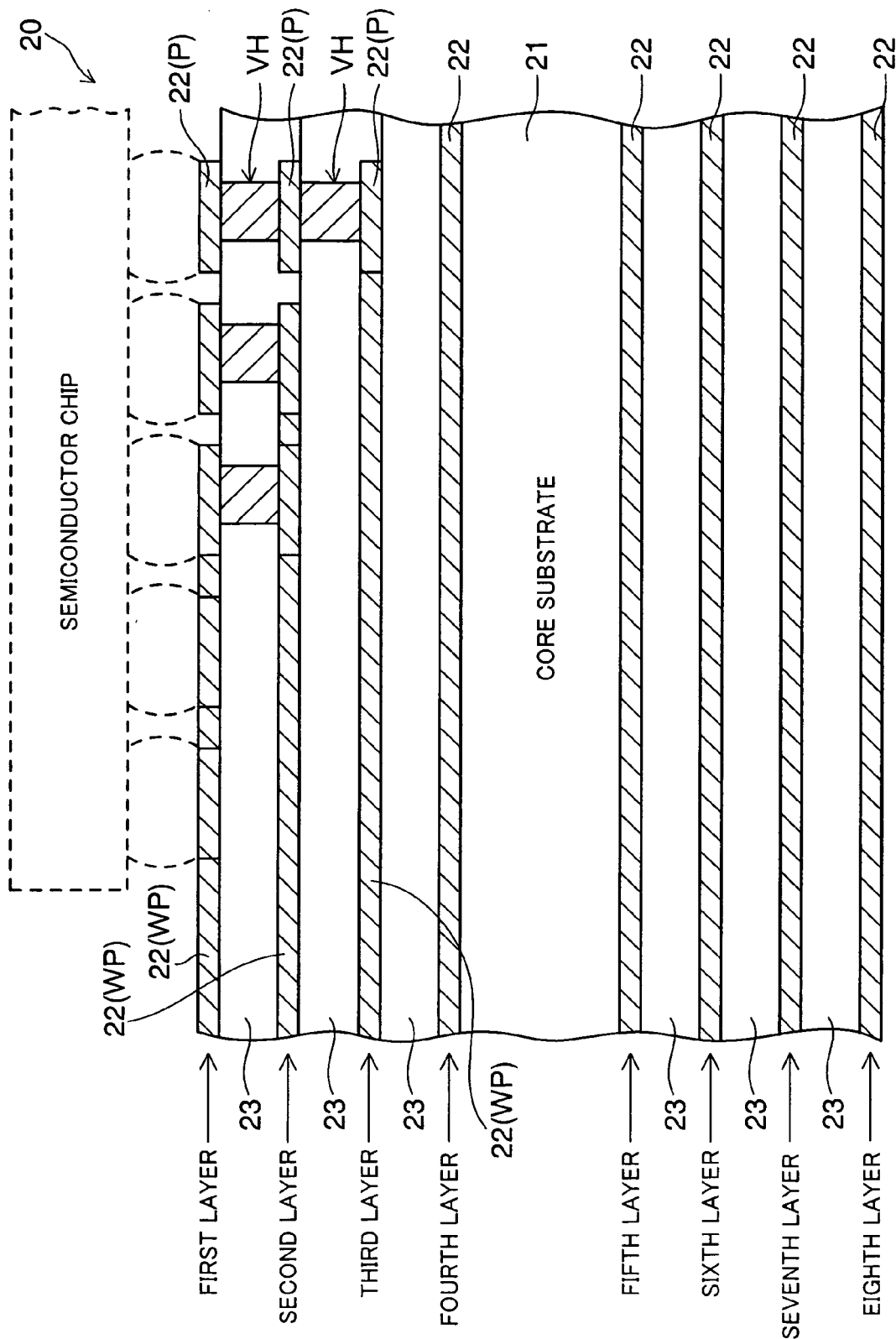
FIG. 5 is a cross-sectional view schematically showing (portion of) the constitution of a multilayer wiring board according to one example of the prior art.
Figure 6A:
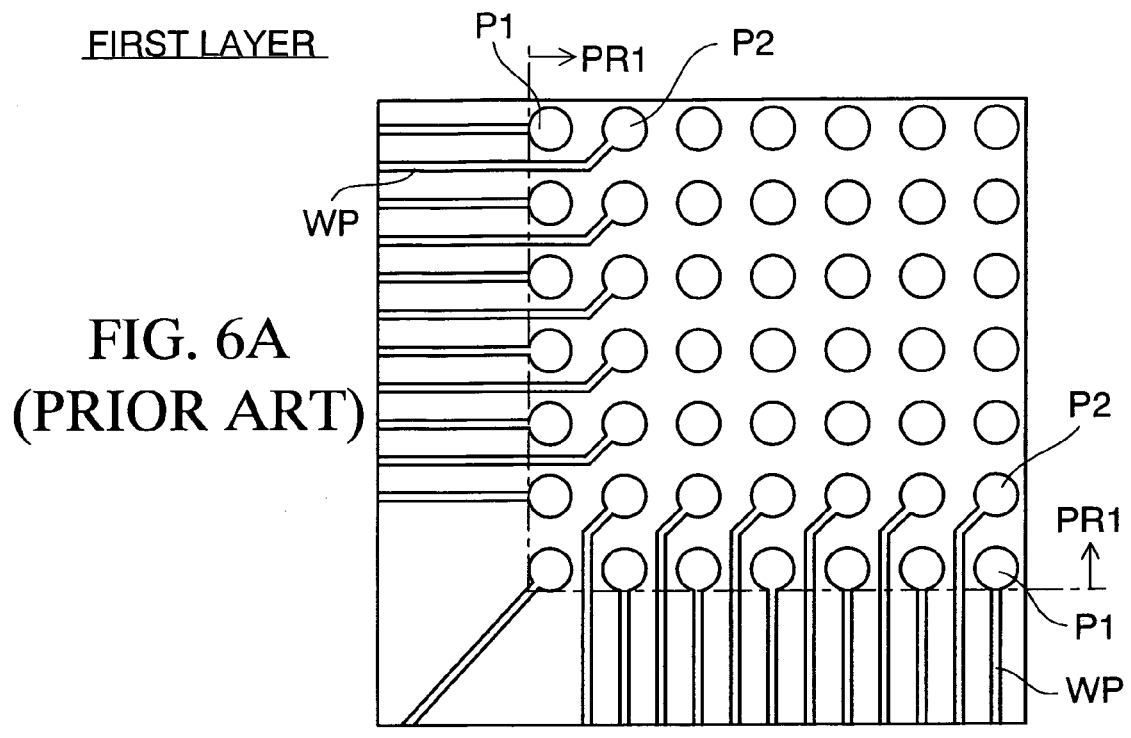
FIGS. 6A and 6B are plan views schematically showing the arrangement of pads and the drawing-out of wiring patterns in (portion of) wiring layers of first and second layers partially constituting the multilayer wiring board of FIG. 5.
Figure 6B:
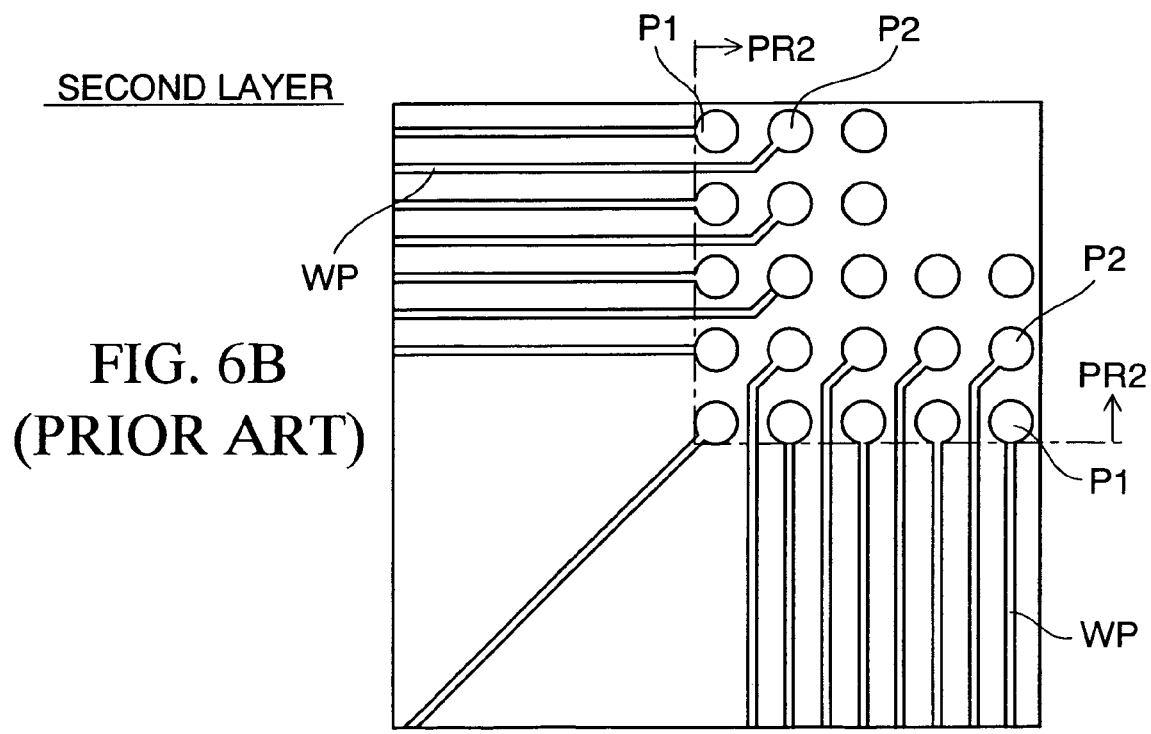

FIG. 1 schematically shows the constitution of a multilayer wiring board according to one embodiment of the present invention, and shows a partial cross-sectional structure thereof. The multilayer wiring board 10 according to this embodiment is a build-up printed circuit board in which a required number (three in the illustrated example) of wiring layers 12 are stacked on each surface of a core substrate 11 with interlayer insulating layers 13 interposed therebetween. Similar to the example shown in FIG. 5, each of the wiring layers 12 is referred to as a wiring layer of a "first layer," that of a "second layer,"..., and that of a "sixth layer," respectively, from the top. Each wiring layer 12 includes a plurality of pads P placed in a predetermined arrangement, and a plurality of wiring patterns WP each of which is formed in such a manner that one end thereof is connected to any one of the plurality of pads P and that the other end thereof is drawn outward (left side in the illustrated example). It is noted that, among the pads P included in the wiring layers 12, there are also pads P to which wiring patterns WP are not connected. Further, the wiring layer 12 (pads P) of the first layer and the wiring layer 12 (pads P) of the second layer are electrically connected to each other by means of via holes VH (conductors filled therein) formed in the interlayer insulating layer 13; and the wiring layer 12 (pads P) of the second layer and the wiring layer 12 (pads P) of the fifth layer are electrically connected to each other by means of via holes VH (conductors filled therein) formed in the interlayer insulating layers 13 respectively formed on the second layer side and the fifth layer side, pads P0 formed in the third and fourth layers on the core substrate 11, and through holes TH (conductors filled therein) formed on the pads P0. Further, a semiconductor chip is mounted by flip-chip bonding on the pads P provided in the wiring layer 12 of the first layer, as indicated by dashed lines in the drawing.

The multilayer wiring board (build-up printed circuit board) 10 according to this embodiment is designed such that when, in the wiring layer 12 constituting each layer, the wiring patterns WP are drawn out from the region in which the pads P are arranged, the wiring patterns WP are drawn out through the spaces between adjacent pads P. The condition for passing at least one wiring pattern WP through the space between adjacent pads P is that the relationship p>w+2 s+c is satisfied, where p is the pitch (center distance) between the pads P, w is the line width of the wiring pattern WP, s is the spacing between the wiring patterns WP, and c is the diameter of the pad P. Accordingly, in the build-up printed circuit board 10 according to this embodiment, it is assumed that the pitch between the pads P, the line width of the wiring pattern WP, and the like, in the wiring layer 12 constituting each layer satisfy this relationship.

Figure 2A:
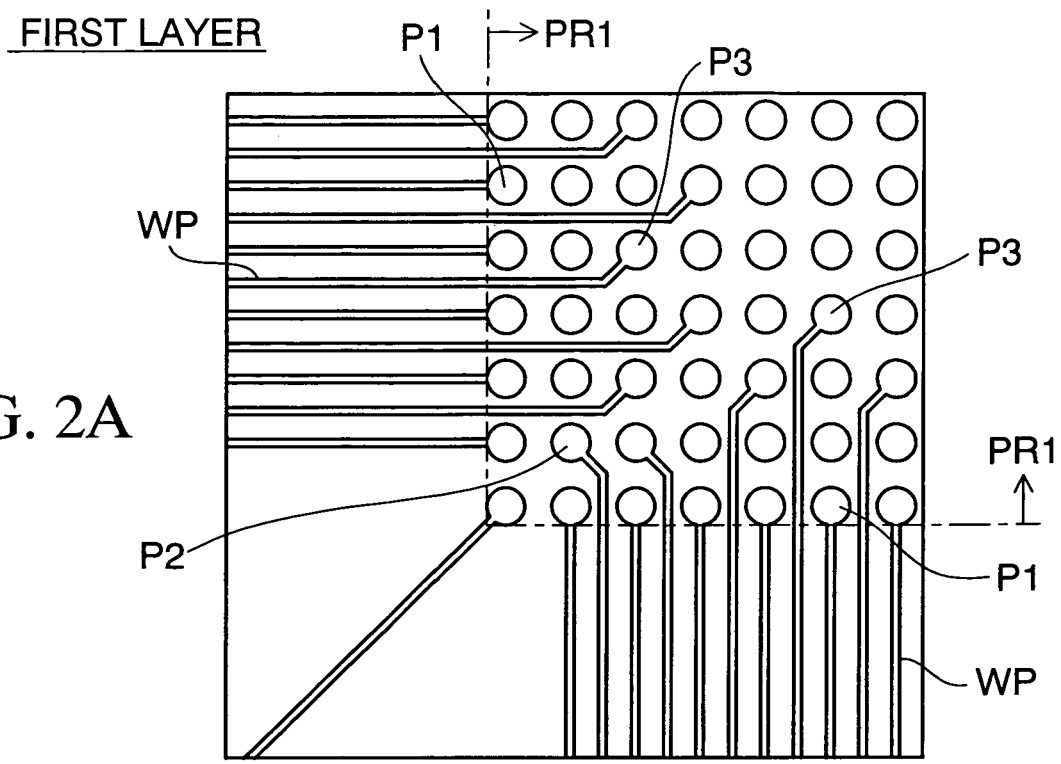
FIGS. 2A and 2B are plan views schematically showing the arrangement of pads and the drawing-out of wiring patterns in (portion of) wiring layers of first and second layers partially constituting the multilayer wiring board of FIG. 1.

FIG. 2A schematically shows the arrangement of pads and the drawing-out of wiring patterns in (portion of) the wiring layer of the first layer partially constituting the build-up printed circuit board 10 of this embodiment. The arrangement of the pads P1, P2, and P3 provided in the wiring layer 12 of the first layer is the same as that of electrodes arranged in a grid pattern on a mount surface of a semiconductor chip to be mounted on the build-up printed circuit board 10.

Constitutional features of the drawing-out for the wiring patterns WP in the first layer are as follows: wiring patterns WP are drawn out from all of pads P1 placed in an outermost portion of a pad placement region PR1; and wiring patterns WP are preferentially drawn out from pads P2 placed on diagonal lines in the vicinities of the corners of the pad placement region PR1 and from pads P3 located in diagonal directions between adjacent rows among pads placed in rows in an internal portion of the pad placement region PR1.

For the pads P2 and P3 located in an internal portion of the pad placement region PR1 among the pads from which the wiring patterns WP are drawn out, the wiring patterns WP are passed through the spaces between adjacent pads to be linearly drawn out to the outside of the pad placement region PR1 as shown in the drawing. Thus, in the arrangement of the wiring patterns WP on the outside of the pad placement region PR1, the wiring patterns WP drawn out from the pads P1 placed in the outermost portion of the pad placement region PR1 and the wiring patterns WP drawn out from the internal portion of the pad placement region PR1 are alternately placed.

Figure 2B:
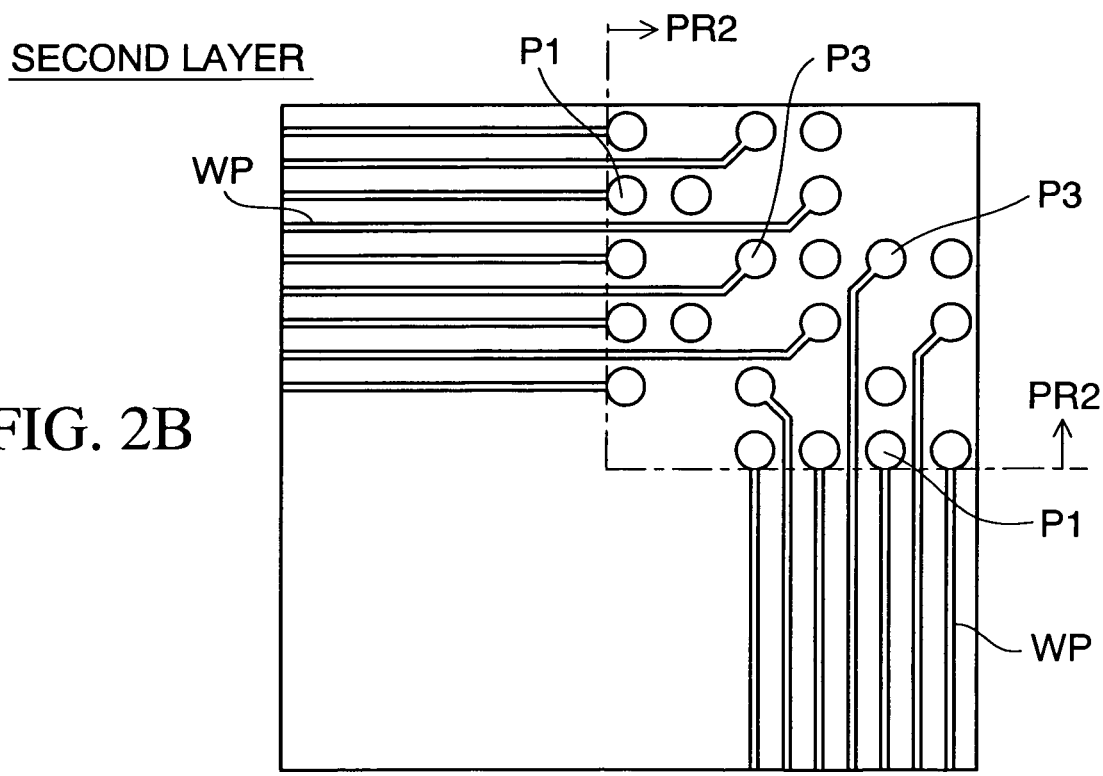

FIG. 2B schematically shows the arrangement of pads and the drawing-out of wiring patterns in (portion of) the wiring layer of the second layer. For the pads from which the wiring patterns WP have been drawn out in the wiring layer of the first layer (FIG. 2A), there is no need to place corresponding pads in the wiring layer of the second layer. Accordingly, the pads provided in the second layer correspond to the pads from which wiring patterns WP are not drawn out in the first layer, and both of these pads are electrically connected to each other through the via holes VH (FIG. 1).

Constitutional features of the drawing-out for the wiring patterns WP in the second layer are as follows: wiring patterns WP are preferentially drawn out from all of pads P1 placed in the outermost portion of a pad placement region PR2 among the pads electrically connected through the via holes VH to pads from which wiring patterns WP are not drawn out in the wiring layer of the first layer; and among pads placed in rows in an internal portion of the pad placement region PR2; and, among pads placed in rows in an internal portion of the pad placement regions PR2, pads P3 located in diagonal directions between adjacent rows or pads (not present in the example shown in FIG. 2B) located apart from each other by a predetermined distance in the lateral direction between adjacent rows.

As in the case of the drawing-out for the wiring patterns WP in the wiring layer of the first layer, for the pads P3 located in an internal portion of the pad placement region PR2 among the pads from which wiring patterns WP are drawn out, wiring patterns WP are linearly drawn out so as to pass through the spaces between the pads P1 in the outermost portion as shown in the drawing. Thus, in the arrangement of the wiring patterns WP on the outside of the pad placement region PR2, the wiring patterns WP drawn out from the pads P1 in the outermost portion of the pad placement region PR2 and the wiring patterns WP drawn out from the pads P3 in the internal portion of the pad placement region PR2 are alternately placed.

Figure 3A:
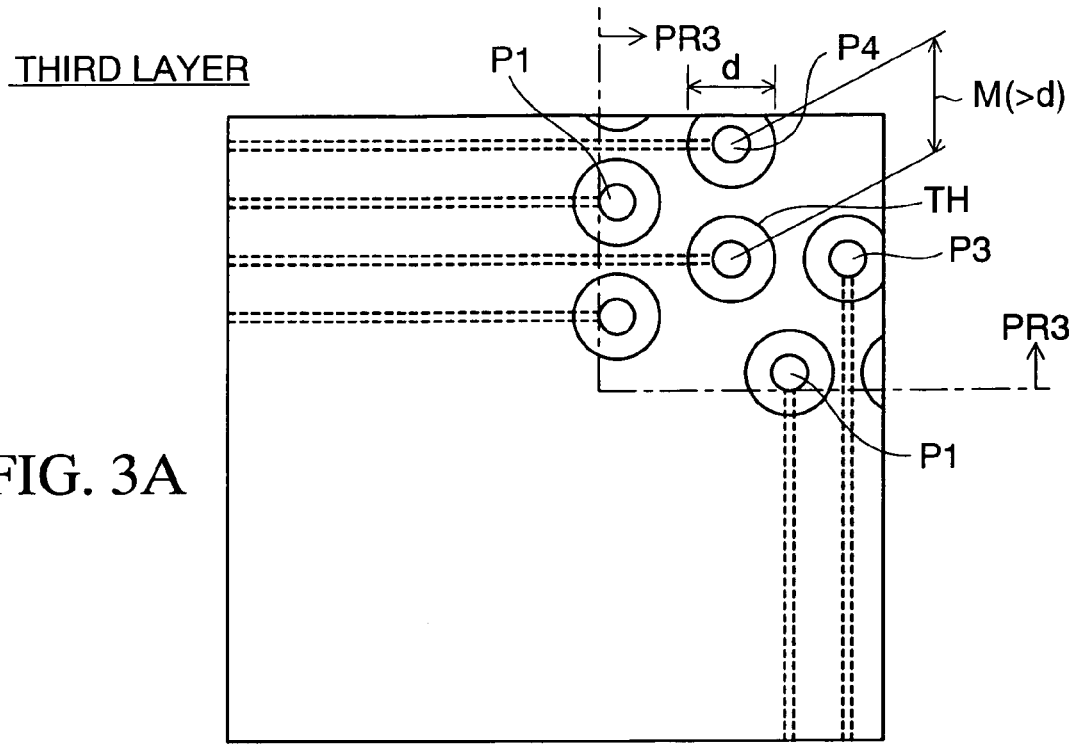
FIGS. 3A and 3B are plan views schematically showing the arrangement of pads in (portion of) a wiring layer of a third layer and the drawing-out of wiring patterns in (portion of) a wiring layer of a fifth layer, which partially constitute the multilayer wiring board of FIG. 1.
Figure 3B:
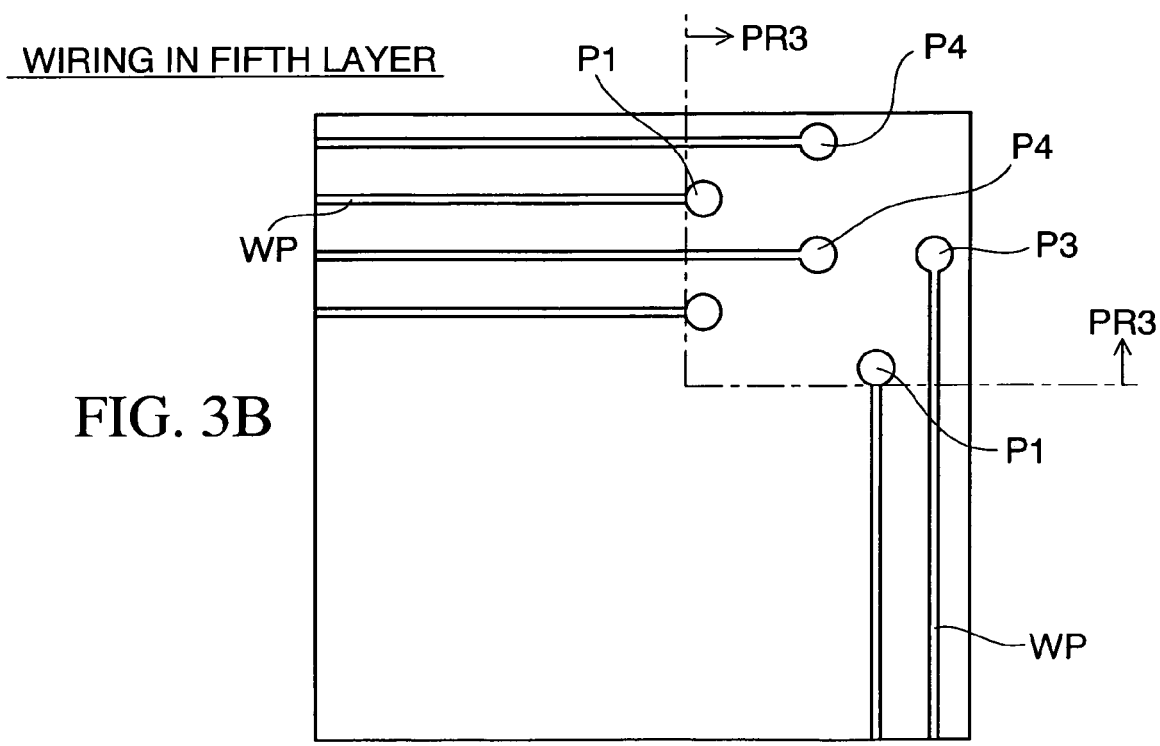
Figure 4:
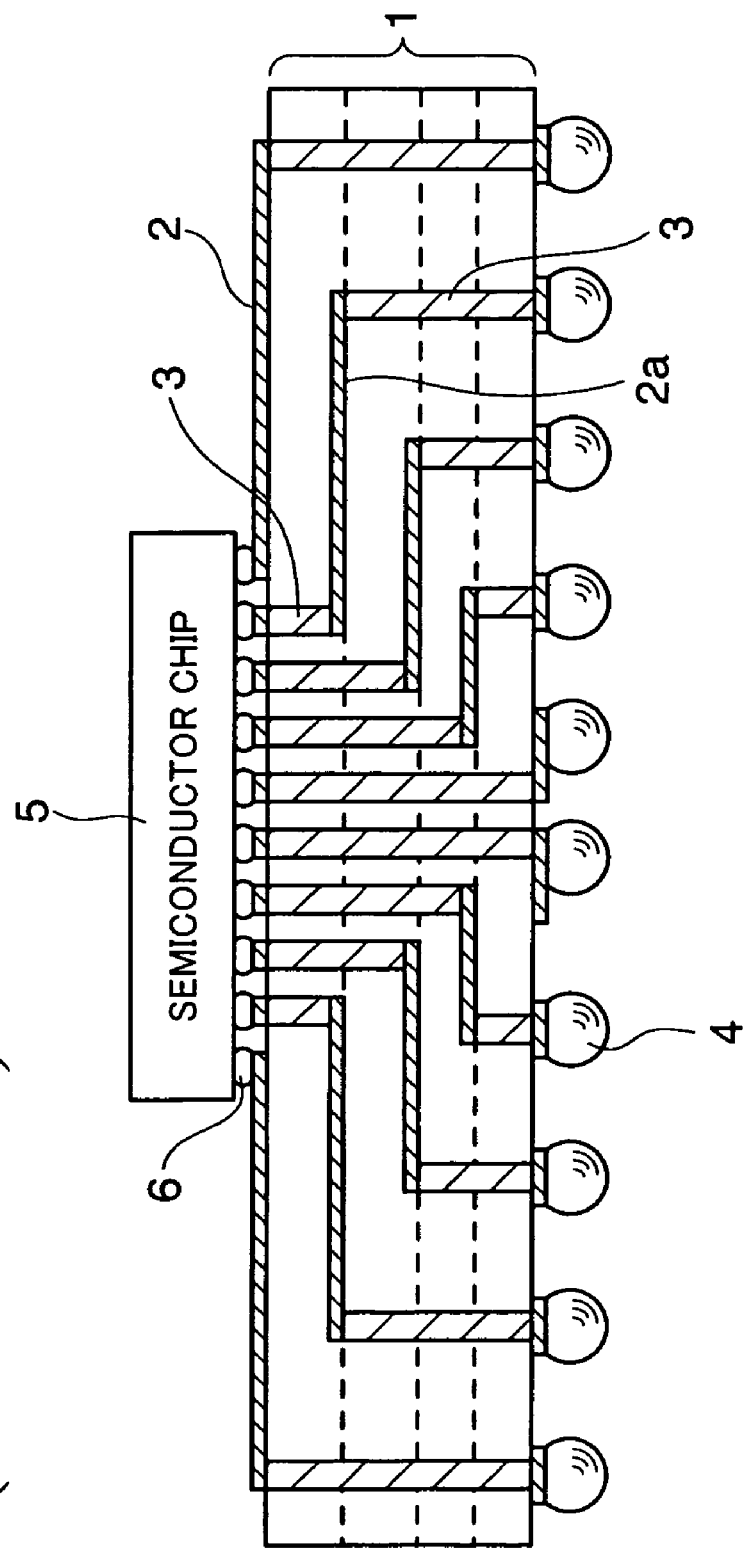
FIG. 4 is a cross-sectional view schematically showing the multilayer wiring board in the state where a semiconductor chip is mounted thereon.

FIGS. 3A and 3B schematically show the arrangement of pads in (portion of) the wiring layer of the third layer and the drawing-out of wiring patterns in (portion of) the wiring layer of the fifth layer. For the pads from which the wiring patterns WP have been drawn out in the wiring layer of the second layer (FIG. 2B), there is no need to place corresponding pads in the wiring layer of the third layer. Accordingly, the pads provided in the third layer correspond to the six pads from which wiring patterns WP are not drawn out in the second layer.

The third and second layers can be electrically connected to each other through the via holes VH (FIG. 1) formed on the six pads. Further, the third layer and the underlying layer (fifty layer on the opposite surface of the core substrate 11 in the example shown in FIG. 1) can also be connected to each other because the regions of the through holes TH (FIG. 3A) to be formed in the core substrate 11 do not overlap each other and the through holes TH can be placed in terms of space.

Namely, wiring patterns can also be fanned out in the third layer as indicated by dashed-lines in FIG. 3A, but can be electrically connected to the fifth layer by means of the through holes TH. Therefore, the wiring patterns WP can also be fanned out in the fifth layer. FIG. 3B shows one example thereof.

Namely, as in the case of the drawing-out for the wiring patterns WP in the wiring layer of the second layer, in this drawing-out for wiring patterns WP in the wiring layer of the fifth layer, wiring patterns WP are drawn out from all of pads P1 placed in an outermost portion of a pad placement region PR3 among pads electrically connected through the via holes VH to pads from which wiring patterns WP are not drawn out in the wiring layer of the second layer; among the pads placed in rows in an internal portion of the pad placement region PR3, from pads P3 located in diagonal directions between adjacent rows; and from pads P4 located apart from each other by a predetermined distance M in the lateral direction between adjacent rows.

Figure 7A:
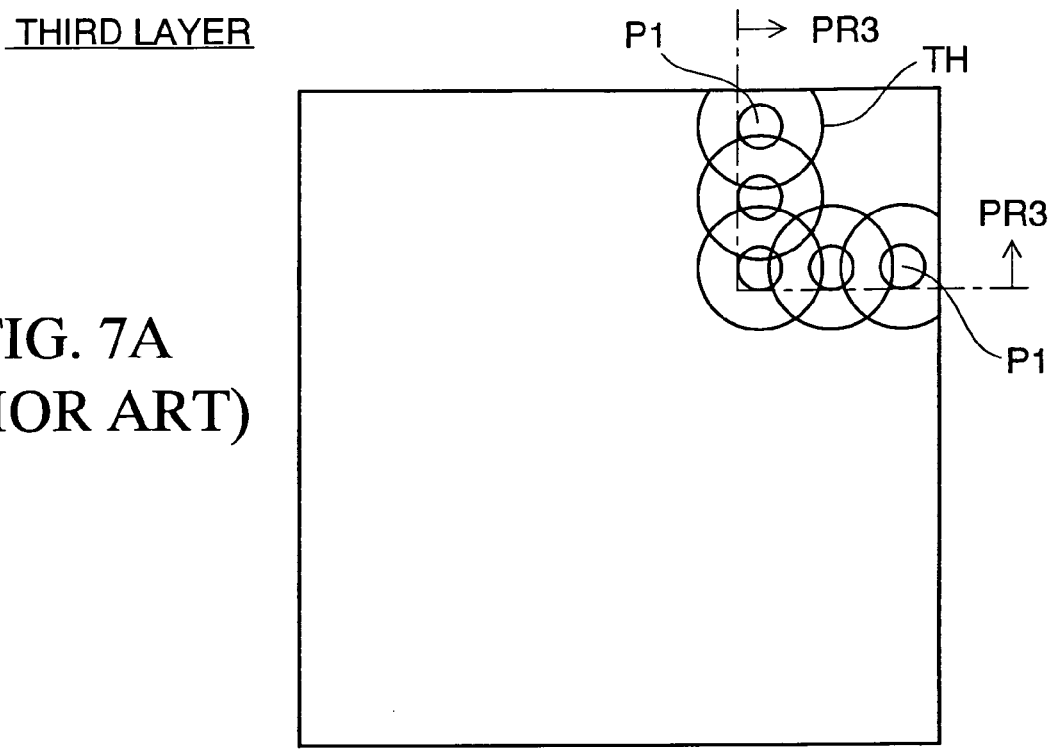
FIGS. 7A and 7B are plan views schematically showing the arrangement of pads and the drawing-out of wiring patterns in (portion of) a wiring layer of a third layer partially constituting the multilayer wiring board of FIG. 5.
Figure 7B:
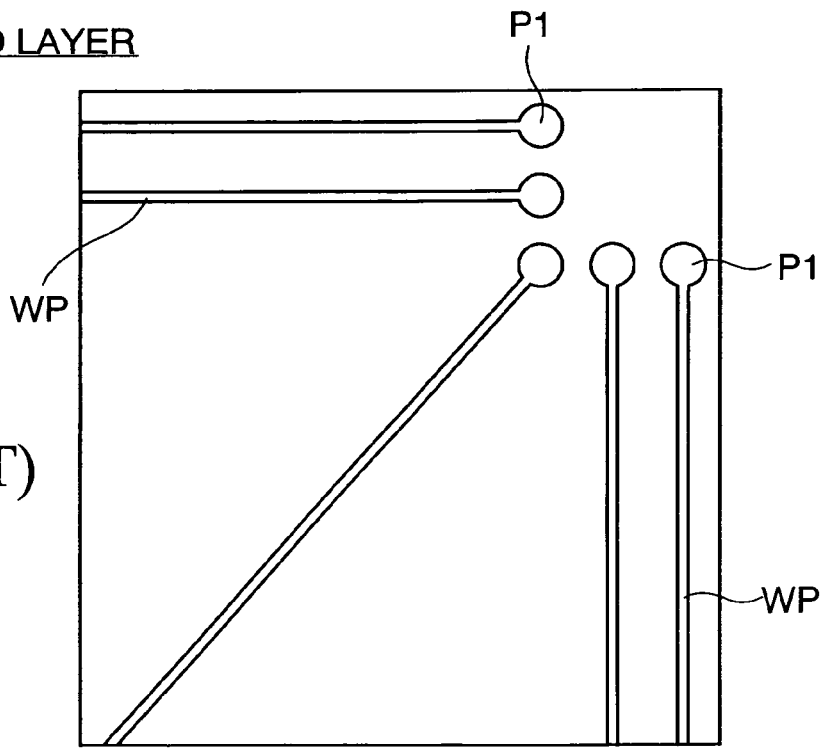

Here, the predetermined distance M is selected to be a value equal to or more than the diameter of the through holes TH to be formed in the core substrate 11. In other words, for pads which are not separated from each other by the distance M in the lateral direction between adjacent rows among the pads placed in rows in the internal portion of the placement region PR3, the regions of through holes TH overlap each other as shown in FIG. 7A, and the through holes cannot therefore be placed. Accordingly, as indicated by dashed lines in FIG. 3A, wiring patterns WP are fanned out in the third layer.

As described above, in the multilayer wiring board (build-up printed circuit board) 10 according to this embodiment, when the wiring patterns WP are drawn out from the region (pad placement region PR1, PR2, or PR3) in which the pads (P1 to P4) are placed in each wiring layer 12, the wiring patterns WP are alternately drawn out from the pads P2 to P4 in an internal portion of the pad placement region, as well as from the pads P1 located in the outermost portion, unlike the prior art in which wiring patterns are drawn out in groups of two rows each in order from an outer portion of a pad placement region. As a result, an area in which through holes TH can be placed can be ensured as shown in FIGS. 3A and 3B, and wiring patterns can be drawn out to the fifth layer on the opposite surface of the core substrate 11. Namely, it is possible to eliminate disadvantages such as encountered in the prior art, i.e., when wiring patterns are drawn out in order from the upper wiring layer, wiring patterns must be drawn out in an intermediate wiring layer; connections to the underlying wiring layer cannot be established by means of via holes or through holes; and as a result, lower wiring layers are not effectively used.

Incidentally, in the constitution (FIG. 5) of the build-up printed circuit board 20 according to the prior art, eight wiring layers need to be stacked. On the other hand, in the constitution (FIG. 1) of the build-up printed circuit board 10 according to this embodiment, six layers are enough. Thus, the number of wiring layers can be effectively reduced. This makes it possible to improve a yield on a product (multilayer wiring board) basis and to reduce a cost. Further, there is no necessity to reduce the diameter of through holes TH or to reduce the line width of wiring pattern WP. Accordingly, this contributes to a further reduction in manufacturing cost.

In the aforementioned embodiment, the description has been made taking a build-up printed circuit board as an example of the form of a multilayer wiring board. However, as apparent from the scope of the present invention, it is a matter of course that the form of a multilayer wiring board is not limited to this example.

What is claimed is:

1. A multilayer wiring board comprising:
a plurality of wiring layers stacked, each wiring layer having a plurality of pads and a plurality of wiring patterns, the plurality of pads being arranged in a grid pattern to correspond to an arrangement of electrodes of an electronic component to be mounted thereon, each wiring pattern being formed so that one end thereof is connected to any one of the plurality of pads and that another end thereof is drawn out to an outside from an inside of a region in which the pads are placed,
wherein in the wiring layer of a first layer on which the electronic component is to be mounted, respective wiring patterns are drawn out from all of pads placed in an outermost portion of the region in which the pads are placed, drawn out from pads placed on a diagonal line in a vicinity of a corner of the relevant region, and drawn out from each pad located in a diagonal direction between adjacent rows among pads placed in rows in an internal portion of the relevant region,
wherein in each of the wiring layers of second and subsequent layers, respective wiring patterns are drawn out from all of pads placed in an outermost portion of a region in which the relevant pads are placed, drawn out from among the pads electrically connected through via holes to the pads from which wiring patterns are not drawn out in the wiring layer of an upper layer, and drawn out from each pad located in a diagonal direction between adjacent rows or from pads located apart from each other by a predetermined distance in a lateral direction among pads placed in rows in an internal portion of the relevant region, wherein the predetermined distance is greater than the pad spacing in the lateral direction, where the lateral direction is a direction in which the adjoining pads are closest, and
wherein the first layer and the second layer are connected by means of via holes and the second layer and a layer below a core substrate, also containing a wiring pattern, are connected by means of via holes and a through hole.

2. The multilayer wiring board according to claim 1, wherein the multilayer wiring board is a build-up printed circuit board in which a required number of wiring layers are stacked on each surface of a core substrate with interlayer insulating layers interposed there between, and wherein, a pad from which a wiring pattern is not drawn out in the wiring layer on one surface of the core substrate, and a pad from which a wiring pattern is drawn out in the wiring layer on another surface of the core substrate, are electrically connected to each other by means of a through hole formed in the core substrate.

3. The multilayer wiring board according to claim 2, wherein the predetermined distance is selected to be a value equal to or more than a diameter of the through hole.

4. The multilayer wiring board according to claim 1, wherein the wiring pattern of a layer directly above the core substrate and directly below the core substrate can overlap.

* * * * *